(12) United States Patent
Uemoto et al.

(10) Patent No.: US 8,344,423 B2
(45) Date of Patent: *Jan. 1, 2013

(54) NITRIDE SEMICONDUCTOR DEVICE AND METHOD FOR FABRICATING THE SAME

(75) Inventors: Yasuhiro Uemoto, Shiga (JP); Masahiro Hikita, Hyogo (JP); Tetsuzo Ueda, Osaka (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/360,275

(22) Filed: Jan. 27, 2012

(65) Prior Publication Data

US 2012/0126290 A1    May 24, 2012

Related U.S. Application Data

(62) Division of application No. 11/878,352, filed on Jul. 24, 2007, now Pat. No. 8,129,748.

(30) Foreign Application Priority Data

Oct. 12, 2006 (JP) ................................. 2006-278913

(51) Int. Cl.
    *H01L 29/66* (2006.01)
(52) U.S. Cl. .......................... 257/192; 257/194; 438/191
(58) Field of Classification Search .................. 257/194, 257/192
    See application file for complete search history.

(56) References Cited

U.S. PATENT DOCUMENTS

| | | | |
|---|---|---|---|
| 6,140,169 A | 10/2000 | Kawai et al. | |
| 6,298,079 B1 | 10/2001 | Tanaka et al. | |
| 7,038,252 B2 | 5/2006 | Saito et al. | |
| 8,129,748 B2 * | 3/2012 | Uemoto et al. | ............... 257/192 |
| 2002/0096692 A1 | 7/2002 | Nakamura et al. | |
| 2004/0195562 A1 | 10/2004 | Munns | |
| 2006/0011915 A1 | 1/2006 | Saito et al. | |

(Continued)

FOREIGN PATENT DOCUMENTS

JP    61-230379 A    10/1986

(Continued)

OTHER PUBLICATIONS

Kawasaki, T. et al., "Normally-off AlGaN/GaN HEMT with Recessed Gate for High Power Applications", Extended Abstracts of the 2005 International Conference on Solid State Devices and Materials, 2005, pp. 206-207, I-1-3, Kobe, Japan.

(Continued)

*Primary Examiner* — Thao Le
*Assistant Examiner* — Geoffrey Ida
(74) *Attorney, Agent, or Firm* — McDermott Will & Emery LLP

(57) ABSTRACT

A nitride semiconductor device includes: a first nitride semiconductor layer; a second nitride semiconductor layer formed on the first nitride semiconductor layer and having a wider band gap than the first nitride semiconductor layer; and a third nitride semiconductor layer formed on the second nitride semiconductor layer. A region of the third nitride semiconductor layer located below the gate electrode is formed with a control region having a p-type conductivity, and a region of the third nitride semiconductor layer located between the gate electrode and each of the source electrode and the drain electrode is formed with a high resistive region having a higher resistance than the that of the control region.

3 Claims, 8 Drawing Sheets

U.S. PATENT DOCUMENTS

| | | |
|---|---|---|
| 2006/0043415 A1 | 3/2006 | Okamoto et al. |
| 2006/0060871 A1 | 3/2006 | Beach |
| 2006/0061674 A1 | 3/2006 | Iida et al. |
| 2006/0273347 A1 | 12/2006 | Hikita et al. |
| 2007/0051978 A1 | 3/2007 | Mita et al. |
| 2008/0073652 A1 | 3/2008 | Sugimoto et al. |
| 2008/0173898 A1 | 7/2008 | Ohmaki |
| 2009/0121775 A1 | 5/2009 | Ueda et al. |

FOREIGN PATENT DOCUMENTS

| | | |
|---|---|---|
| JP | 63-161677 A | 7/1988 |
| JP | 11-261053 | 9/1999 |
| JP | 2004-273486 | 9/2004 |
| JP | 2005-244072 | 9/2005 |
| WO | WO-03/032397 A2 | 4/2003 |

OTHER PUBLICATIONS

Kuroda, M. et al., "Normally-off Operation of Non-polar AlGaN/GaN Heterojunction FETs Grown on R-plane Sapphire", Extended Abstracts of the 2005 International Conference on Solid State Devices and Materials, 2005, pp. 470-471, I-5-2, Kobe, Japan.

United States Notice of Allowance issued in U.S. Appl. No. 11/878,352, mailed Nov. 7, 2011.

* cited by examiner

NITRIDE SEMICONDUCTOR DEVICE AND METHOD FOR FABRICATING THE SAME

CROSS-REFERENCE TO RELATED APPLICATIONS

This application is a Divisional of U.S. application Ser. No. 11/878,352 filed on Jul. 24, 2007, now U.S. Pat. No. 8,129,748, which claims priority under 35 U.S.C. §119 on Patent Application No. 2006-278913 filed in Japan on Oct. 12, 2006, the entire contents of which are hereby incorporated by reference.

BACKGROUND OF THE INVENTION (a) Fields of the Invention

The present invention relates to nitride semiconductor transistors and their fabrication methods. In particular, the present invention relates to normally-off type nitride semiconductor transistors applicable to power switching devices, and their fabrication methods.

(b) Description of Related Art

In recent years, field effect transistors (FET) made of gallium nitride (GaN)-based materials have been widely investigated for high frequency devices and high power devices. As the GaN-based nitride semiconductor, not only GaN but also aluminum nitride (AlN), indium nitride (InN), and the like are used. Since these nitride semiconductors can form various types of compound materials, they can form heterojunctions like conventional arsenic-based semiconductors such as gallium arsenide (GaAs). However, in the heterojunction of the nitride semiconductor, even though impurities are not added in the nitride semiconductors intentionally, spontaneous polarization and piezoelectric polarization produces high sheet carrier densities at the interface thereof. As a result of this, most of GaN-based heterojunction FETs exhibit depletion (normally-on) characteristics, and it is difficult to exhibit enhancement (normally-off) characteristics. Aiming at the practical applications, normally-off operation is strongly desired for FETs fabricated using the nitride semiconductor in order to make the GaN devices compatible with currently used Si-based power MOSFETs/IGBTs for safe operation.

Conventional structures of normally-off type FETs using nitride semiconductors include: a structure in which the thickness and/or the Al mole fraction of an AlGaN layer are decreased; a structure in which a gate region is partially recessed to shift a threshold voltage positively (see, for example, T. Kawasaki et al., "Solid State Devices and Materials 2005 tech. digest", 2005, pp. 206); the structure in which a FET is fabricated on the (10–12) plane of a sapphire substrate to prevent a polarization electric field from being generated in the crystal growth direction of the nitride semiconductor (see, for example, M. Kuroda et al., "Solid State Devices and Materials 2005 tech. digest", 2005, pp. 470); and the like.

As a promising structure for obtaining the normally-off type FET, a junction field effect transistor (JFET) is proposed in which a p-type GaN layer is formed as gate (see, for example, Japanese Unexamined Patent Publication No. 2005-244072). In a conventional JFET, a buffer layer, a channel layer of undoped GaN, and a barrier layer of n-doped AlGaN are sequentially formed over a substrate. On the barrier layer, a source electrode and a drain electrode are formed separately. Between the source electrode and the drain electrode, a gate electrode is formed with a p-GaN layer.

In the conventional JFET structure, piezoelectric polarization generated at the heterointerface between the channel layer of undoped GaN and the barrier layer of AlGaN is cancelled by piezoelectric polarization generated at the heterointerface between the barrier layer of AlGaN and the p-type GaN layer. This structure decreases the concentration of two-dimensional electron gas in an area just below the gate, whereby the normally-off characteristics can be obtained. In addition, a pn junction gate having a higher built-in potential than a Schottky junction, provides an advantage that even though a positive gate voltage is applied, a gate leakage current can be maintained at lower level.

However, unlike a silicon semiconductor, it is difficult to form p-type or n-type conductive areas selectively by ion implantation or thermal diffusion in the nitride semiconductors. Thus, a promising approach to form the p-type gate is, for example, a selective regrowth of a p-type nitride semiconductor just only at the gate area. In such selective regrowth, however, silicon which acts as a n-type impurity in nitride semiconductor is easily segregated at the regrowth interface. So it is difficult to obtain a good pn junction in this method.

Another promising approach to form the p-type gate is a selective etching method in which a p-type nitride semiconductor is deposited and etched locally remaining the portions of the p-type nitride semiconductor layer only at the gate area. This method, however, has a serious problem that the etching of the p-type nitride semiconductor layer causes electrical damages at the channel region and it is difficult to obtain good electrical properties of FETs. When the channel region is damaged by etching, the carrier concentration in the channel region between the gate and the drain decreases to cause a reduction in drain current. Moreover, trapping of electrons into defects created on the surface of the channel region or other damage-induced influences inhibit a fast switching operation, that is, a so-called current collapse occurs.

SUMMARY OF THE INVENTION

An object of the present invention is to solve the conventional problems described above, and to provide a nitride semiconductor device which has a large operating current with normally-off operation and excellent switching characteristics.

To attain the above object, in the present invention, a nitride semiconductor device is designed so that a control region with a p-type impurity activated therein is provided in a region below a gate electrode.

To be more specific, a nitride semiconductor device according to the present invention is characterized in that it includes: a first nitride semiconductor layer; a second nitride semiconductor layer; a third nitride semiconductor; and a gate electrode. The first nitride semiconductor layer is formed over a substrate. The second nitride semiconductor layer is formed on the first nitride semiconductor layer and has a wider band gap than the first nitride semiconductor layer. The third nitride semiconductor layer is formed on the second nitride semiconductor layer and includes a control region with a p-type conductivity and a high resistive region formed around the control region and having a higher resistance than that of the control region. The gate electrode is formed on the control region.

With the nitride semiconductor device of the present invention, a forward bias voltage with respect to the channel region is applied to the control region to inject holes into the channel region. The injected holes induce generation of additional electrons in the channel region, so that the carrier concentration in the channel region is increased significantly. As a result of this, the normally-off type nitride semiconductor transistor having an increased operating current is obtained. Furthermore, the third nitride semiconductor layer is formed on the second nitride semiconductor layer, in which the distance between the surface and the channel region is enlarged and it becomes negligible to receive the influence of the surface. As a result of this, a decrease in carrier concentration in the channel region and occurrence of current collapse are prevented.

A method for fabricating a nitride semiconductor device according to the present invention is characterized in that it includes: the step (a) of forming, over a substrate, a first nitride semiconductor layer, a second nitride semiconductor layer, and a third nitride semiconductor layer in this order from bottom to top, the second nitride semiconductor layer having a wider band gap than the first nitride semiconductor layer; the third nitride semiconductor layer containing a p-type impurity combining with hydrogen; the step (b) of forming a control region having a p-type conductivity by hydrogen desorption from a portion of the third nitride semiconductor layer; the step (c) of forming a gate electrode on the control region; and the step (d) of forming a source electrode and a drain electrode on both sides of the gate electrode, respectively, the source electrode and the drain electrode being electrically connected to a channel region.

With the method for fabricating a nitride semiconductor device according to the present invention, in selectively forming the control region with p-type conductivity, the third nitride semiconductor layer does not have to be etched. Therefore, the second nitride semiconductor layer is prevented from being damaged by etching, and thereby the nitride semiconductor device of this invention shows the large operating current and fast switching operation characteristics.

BRIEF DESCRIPTION OF THE DRAWINGS

FIG. 2A shows the energy band in the control region, and FIG. 2B shows the energy band in a region other than the control region.

FIG. 3A is a graph showing the drain current and the gate voltage characteristics, and FIG. 3B is a graph showing the drain current and the drain voltage characteristics.

BEST MODE FOR CARRYING OUT THE INVENTION

First Embodiment

Figure 1:
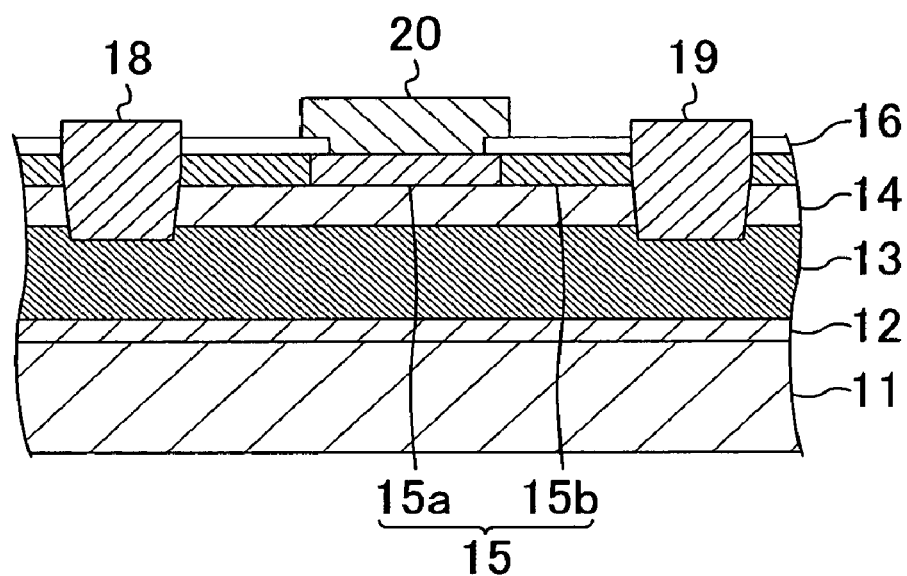
FIG. 1 is a cross sectional view of a nitride semiconductor transistor according to a first embodiment of the present invention.

A first embodiment of the present invention will be described with reference to the accompanying drawings. FIG. 1 shows a cross-sectional structure of a nitride semiconductor transistor according to the first embodiment of the present invention.

Referring to FIG. 1, a substrate 11 is made of silicon and its principal plane is the (111) plane. A buffer layer 12 of AlN having a thickness of 100 nm is formed on the principal plane of the substrate 11.

A first nitride semiconductor layer 13 of undoped GaN having a thickness of 2 μm and a second nitride semiconductor layer 14 of undoped $Al_{0.15}Ga_{0.85}N$ having a thickness of 25 nm are formed on the buffer layer 12. A channel region of the transistor which will be described later is formed in the interface region between the first nitride semiconductor layer 13 and the second nitride semiconductor layer 14.

On the second nitride semiconductor layer 14, a third nitride semiconductor layer 15 is formed which is made of $Al_{0.15}Ga_{0.85}N$ doped with magnesium (Mg) and has a thickness of 200 nm. The third nitride semiconductor layer doped with Mg is composed of: a control region 15a in which Mg is activated to exhibit a p-type conductivity; and a high resistive region 15b in which Mg is not activated to offer a higher resistance than the control region 15a. The control region 15a is formed in the shape of, for example, stripes each having a width of 1 μm.

A hydrogen diffusion barrier film 16 of AlN having a thickness of 100 nm is formed on the third nitride semiconductor layer 15. The hydrogen diffusion barrier film 16 has an opening for exposing the control region 15a. On the hydrogen diffusion barrier film 16, a gate electrode 20 is formed to cover the opening. The gate electrode 20 is made of palladium (Pd), and comes into ohmic contact with the control region 15a.

Both sides of the gate electrode 20, a source electrode 18 and a drain electrode 19 are formed, respectively. The source electrode 18 and the drain electrode 19 are each made of titanium (Ti) and aluminum (Al), and formed on the partly recessed first nitride semiconductor layer 13 through the hydrogen diffusion barrier film 16, the high resistive region 15b of the third nitride semiconductor layer 15, and the second nitride semiconductor layer 14. With such a structure, the source electrode 18 and the drain electrode 19 can obtain good ohmic contact characteristics with a channel region at the heterointerface between the first nitride semiconductor layer 13 and the second nitride semiconductor layer 14. The separation length from the control region 15a to the drain electrode 19 is preferably set at 3 μm or greater in order to increase the drain breakdown voltage.

Note that only one transistor is illustrated in FIG. 1, but multi transistors could be arrayed in which unit structures isolated by an isolation region (not shown) are formed.

Figure 2A:
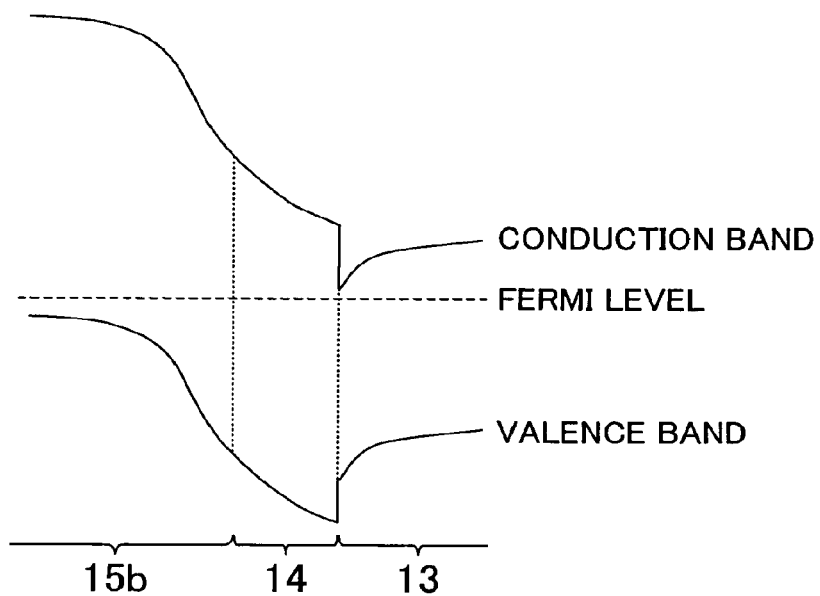
FIGS. 2A and 2B show energy band structures of the nitride semiconductor transistor according to the first embodiment of the present invention.
Figure 2B:
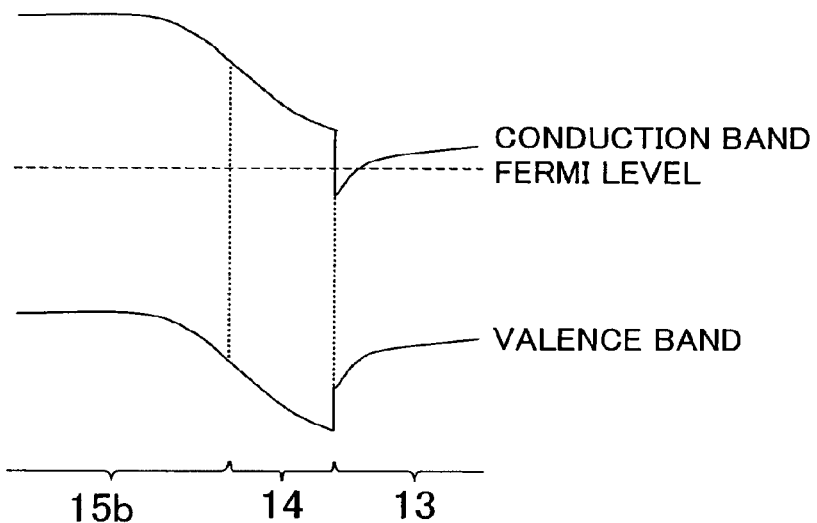

The following description will be made of the principle of operation of the transistor according to the first embodiment. FIGS. 2A and 2B show energy bands of the transistor according to the first embodiment. FIG. 2A shows the energy band in the control region, and FIG. 2B shows the energy band in a region other than the control region.

Referring to FIGS. 2A and 2B, in both of the control region and the region other than the control region, the conduction band has a discontinuity at the heterointerface between the first nitride semiconductor layer 13 and the second nitride semiconductor layer 14. In the region other than the control region, as shown in FIG. 2B, at the heterointerface the conduction band is located at a lower level than the Fermi level, and thus 2 DEG is created. The p-type impurity contained in the third nitride semiconductor layer 15 in the region other than the control region is not activated and thus the third nitride semiconductor layer 15 in the region other than the control region acts as high resistive layer. On the other hand, in the control region, as shown in FIG. 2A, the p-type impurity contained in the third nitride semiconductor layer 15 is activated and thus the energy levels of the second nitride semiconductor layer 14 and the first nitride semiconductor layer 13 are lifted up. As a result of this, the conduction band at the heterointerface between the first nitride semiconductor layer 13 and the second nitride semiconductor layer 14 is located at a higher level than the Fermi level. Therefore, when no bias voltage is applied to the control region, 2 DEG is not created at the heterointerface. This results in obtaining the normally-off characteristics of nitride semiconductor transistors.

For example, the number of electrons in the 2 DEG layer created in the interface region between 2 μm-thick undoped GaN and 25 nm-thick undoped $Al_{0.15}Ga_{0.85}N$ is about $1 \times 10^{13}$ $cm^{-2}$. The Mg concentration doped into the third nitride semiconductor layer 15 is set at about $1 \times 10^{19}$ $cm^{-3}$, and the carrier concentration in the control region 15a is set at about $1 \times 10^{18}$ $cm^{-3}$. In this condition, when the thickness of the control region 15a is set at 200 nm, a p-type carrier concentration of about $2 \times 10^{13}$ $cm^{-2}$ can be provided. The number of holes contained in the control region 15a can be more than the number of electrons generated in the channel region when the control region 15a does not exist, and thereby the normally-off type nitride semiconductor transistor can be obtained.

In the transistor of the first embodiment, holes are injected into the channel region by forward biasing the control region with respect to the channel region. Since the hole mobility of the nitride semiconductor is much lower than the electron mobility thereof, the holes injected into the channel region hardly contribute as carriers for drain currents. The holes injected from the control region generate, in the channel region, electrons as many as the number of injected holes. This makes it possible to dramatically increase a current flowing in the channel region, and thereby a transistor with a large operating current can be obtained.

Furthermore, by designing the band gap in the control region larger than the band gap in the channel region, the amount of holes to be injected from the control region into the channel region can be made greater than the amount of electrons to be injected from the channel region into the control region. This makes it possible to further efficiently increase the carrier concentration in the channel region.

As the mobility of holes injected into the channel region is much smaller than that of electrons, the effect of generating electrons in the channel region is increased. Then, the holes act like as donor ions. That is to say, the carrier concentration can be modulated in the channel region, so that a normally-off type nitride semiconductor transistor with a large operating current can be obtained.

The transistor structure of the present invention is similar to that of a junction field effect transistor (JFET). However, in the point that carriers are injected intentionally, it operates by an entirely different principle of operation from the JFET in which a gate electric field modulates carriers in the channel region.

Figure 3A:
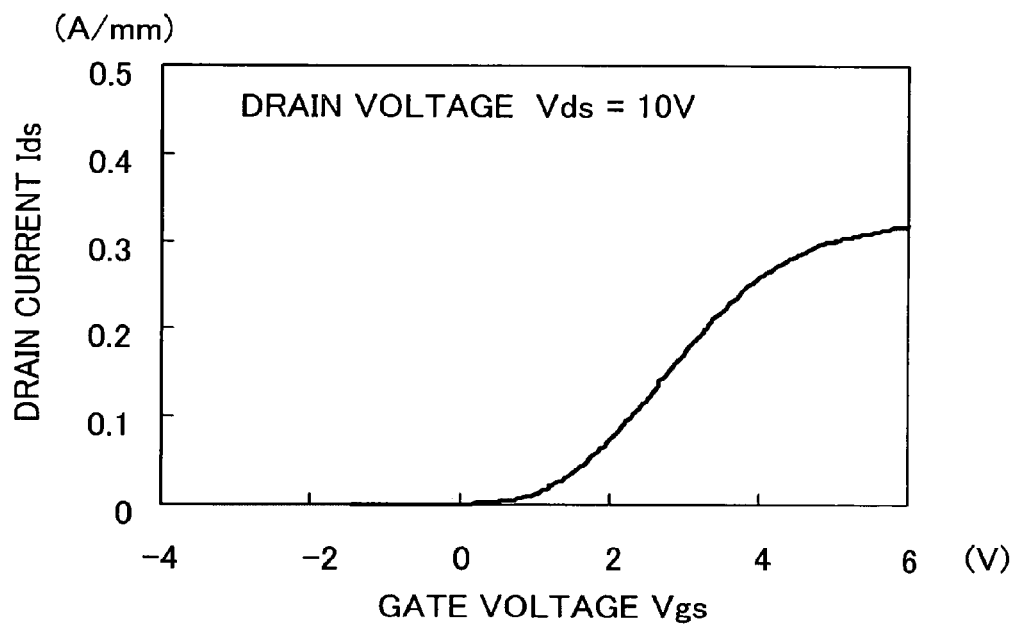
FIGS. 3A and 3B are graphs showing the characteristics of the nitride semiconductor transistor according to the first embodiment of the present invention.
Figure 3B:
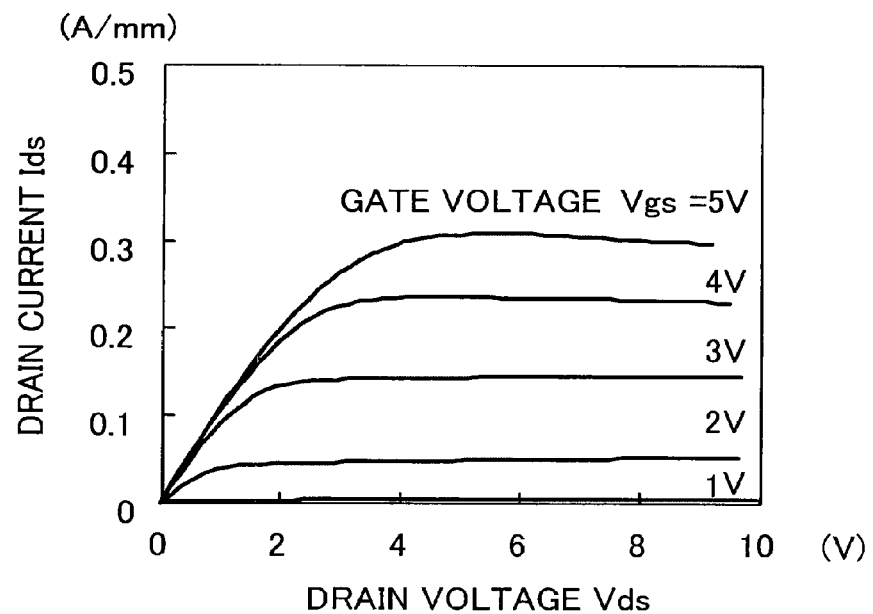

FIGS. 3A and 3B are graphs showing the characteristics of the transistor according to the first embodiment. FIG. 3A shows the drain current and the gate voltage characteristics, and FIG. 3B shows the drain current and the drain voltage characteristics. As shown in FIGS. 3A and 3B, the obtained threshold voltage is 1 V, and the transistor exhibits normally-off characteristics. Even when a positive bias of 5 V or higher is applied to the gate electrode, no significant gate-leakage current is observed and a maximum drain current of about 300 mA/mm is obtained.

In a nitride semiconductor transistor, a thin AlGaN layer with a thickness of 20 to 30 nm is formed on a GaN layer, and the heterointerface between the GaN layer and the AlGaN layer serves as a channel region. Also, the AlGaN layer is provided as the surface of the transistor. With this structure, the distance from the surface of the transistor to the channel region becomes very short, and thus the transistor tends to be affected by electron trapping resulting from crystal defects in the surface of the nitride semiconductor or the like. If the transistor is affected by the electron trapping, on-off switching of the current of the transistor cannot be carried out in a short time in the on-off switching operation. This will cause a so-called current collapse in which a current capable of being activated greatly decreases, which inhibits a fast switching operation. However, the transistor of the first embodiment has the third nitride semiconductor layer formed on the second nitride semiconductor layer. Therefore, an adequate distance can be secured between the surface of the transistor and the channel region, which in turn provides the effect of preventing the current collapse.

Hereinafter, a method for fabricating a transistor according to the first embodiment will be described. First, by a metal organic chemical vapor deposition (MOCVD) method, the buffer layer 12 of AlN, the first nitride semiconductor layer 13 of undoped GaN, and the second nitride semiconductor layer 14 of undoped $Al_{0.15}Ga_{0.85}N$ are sequentially grown on the substrate 11. Thereafter, the third nitride semiconductor layer 15 of $Al_{0.15}Ga_{0.85}N$ is grown with Mg doped as a p-type impurity. Then, the hydrogen diffusion barrier film 16 of AlN is formed.

Next, the hydrogen diffusion barrier film 16 is selectively etched to form an opening for exposing the third nitride semiconductor layer 15.

Subsequently, in a nitrogen gas ($N_2$ gas) atmosphere, a thermal treatment is performed at 800° C. for about 20 to 60 minutes. Thereby, in the portion of the third nitride semiconductor layer 15 exposed from the opening, Mg contained therein is activated to form the control region 15a having a p-type conductivity. Note that instead of $N_2$ gas, an inert gas such as argon may be used.

When, for example, Mg is doped as a p-type impurity during crystal growth for the nitride semiconductor layer by a MOCVD method, Mg is introduced into the nitride semiconductor. However, Mg introduced into the nitride semiconductor is inactivated in which it is combined with a hydrogen atom. When a thermal treatment is performed in an inert gas atmosphere at 800° C. for about 20 to 60 minutes, the hydrogen atom is desorbed from Mg. Then, the Mg is activated, and thus the nitride semiconductor layer shows p-type conductivity.

Figure 4:
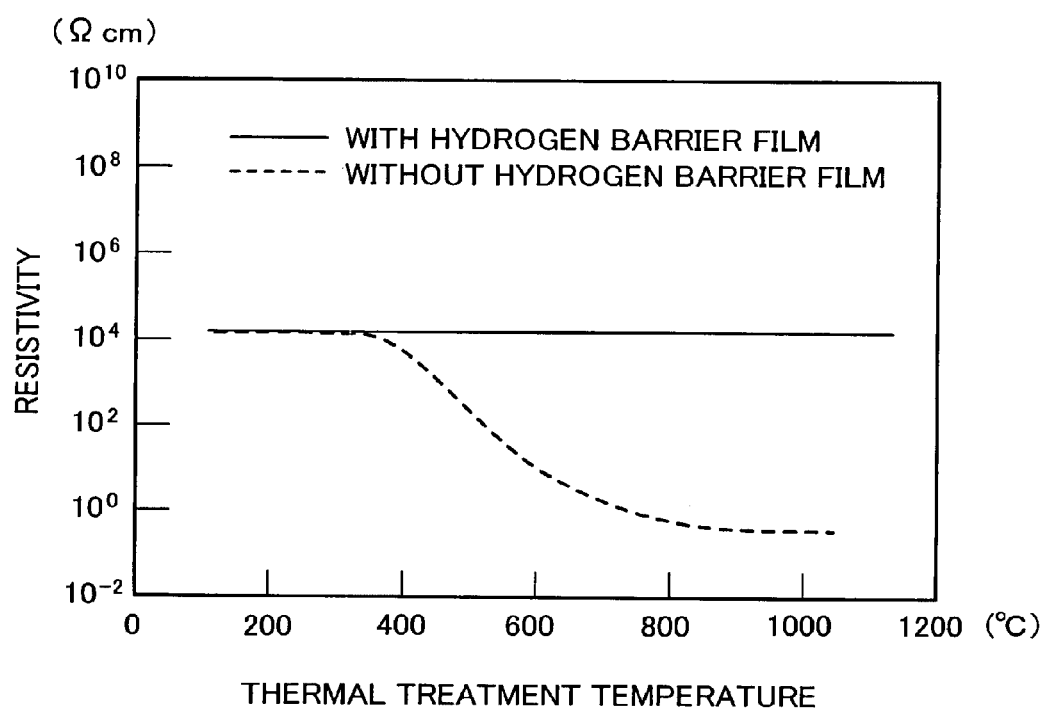
FIG. 4 is a graph showing the correlation between the temperature of a thermal treatment and the resistivity of a nitride semiconductor layer containing a p-type impurity in the nitride semiconductor transistor according to the first embodiment of the present invention.

FIG. 4 shows the correlation between the temperature of the thermal treatment and the resistivity in the case where an $Al_{0.15}Ga_{0.85}N$ layer doped with Mg to have a concentration of about $1 \times 10^{19}$ cm$^{-3}$ is subjected to a thermal treatment. The thermal treatment was performed in a nitrogen atmosphere for 20 minutes. As shown in FIG. 4, in the case of forming no hydrogen diffusion barrier film of AlN, the resistivity of the Mg doped $Al_{0.15}Ga_{0.85}N$ layer decreases with an increasing temperature of the thermal treatment, and becomes almost constant at around 800° C. On the other hand, in the case of forming the hydrogen diffusion barrier film of AlN, the resistivity of the Mg doped $Al_{0.15}Ga_{0.85}N$ layer is almost constant even though the temperature of the thermal treatment is increased. This indicates the fact that formation of the hydrogen diffusion barrier film blocks hydrogen desorption from Mg to keep Mg inactivated state.

In the first embodiment, the thermal treatment is performed in the state in which the third nitride semiconductor layer 15 with Mg doped therein is covered with the hydrogen diffusion barrier film 16 having the opening. Thus, in the portion of the third nitride semiconductor layer 15 exposed from the opening, hydrogen atoms are desorbed from Mg, so that the p-type impurity is activated. However, in the portion of the third nitride semiconductor layer 15 covered with the hydrogen diffusion barrier film 16, less or no hydrogen desorbs from Mg, so that Mg is not activated. As a result of this, selective formation can be made of: the control region 15a in which the p-type impurity is activated to exhibit a p-type conductivity; and the high resistive region 15b in which the p-type impurity is not activated to offer a high resistive layer.

As described above, with the method for fabricating a transistor according to the first embodiment, the p-type control region can be formed locally without etching the nitride semiconductor, and by a simple process, the transistor gate can be formed without any damages.

It is desirable that the high resistive region have a higher resistance. However, it is required that it has at least a higher resistance than the control region, and it is preferable that the difference between the resistivity of the high resistive region and the resistivity of the control region should be equal to or more than four orders of magnitude.

In the first embodiment, a silicon substrate whose principal plane is the (111) plane is used as a substrate. Alternatively, a substrate made of silicon carbide (SiC), gallium nitride (GaN), sapphire, or the like may be employed thereas. The principal plane of the substrate may have any plane direction as long as it can provide good crystal quality of nitride semiconductor layer. The second nitride semiconductor layer 14 and the third nitride semiconductor layer do not have to have the same Al composition, and the third nitride semiconductor layer may be made of GaN without Al. Description has been made of the example where the first nitride semiconductor layer and the second nitride semiconductor layer are undoped, but the case where the second nitride semiconductor layer contains an n-type impurity such as Si also exerts the same effect.

The case where the hydrogen diffusion barrier film 16 is made of AlN has been shown in this embodiment, but instead of AlN, aluminum oxide ($Al_2O_3$), silicon nitride (SiN), or the like may be employed. In the case where a thermal treatment step of exposing the transistor to a temperature of 400° C. or higher is not carried out after formation of the control region 15a, the hydrogen diffusion barrier film 16 may be removed after formation of the control region 15a.

The case where the gate electrode 20 is made of Pd has been shown in this embodiment. However, it is sufficient that it can be brought into ohmic contact with the control region, so that nickel or the like may be used thereas. Or, a stacked film made of multi layers of metal materials may be used thereas. The case where the source electrode 18 and the drain electrode 19 are formed to make direct contact with the channel region has been exemplarily shown in this embodiment. However, as long as they can obtain ohmic contact with the channel region, they do not necessarily have to make direct contact to the channel region.

Second Embodiment

Figure 5:
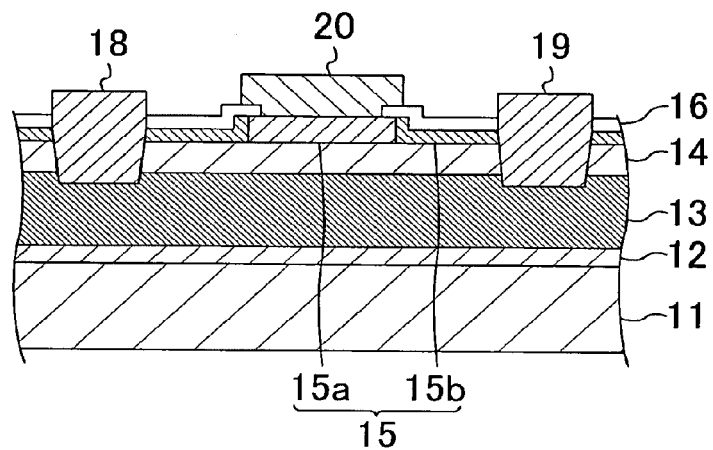
FIG. 5 is a cross sectional view showing a nitride semiconductor transistor according to a second embodiment of the present invention.

A second embodiment of the present invention will be described below with reference to the accompanying drawings. FIG. 5 shows a cross-sectional structure of a nitride semiconductor transistor according to the second embodiment. The description of the components shown in FIG. 5 that are the same as those shown in FIG. 1 will be omitted by retaining the same reference numerals.

Referring to FIG. 5, the transistor according to the second embodiment has a thin portion formed in a portion of the high resistive region 15b located between the control region 15a and each of the drain electrode 19 and the source electrode 18.

As the resistance of the high resistive region 15b between the control region 15a and the drain electrode 19 is higher, a greater amount of leakage current between the gate and the drain can be reduced. The resistance of the high resistive region 15b increases with a decreasing thickness. Therefore, in the transistor of the second embodiment, the high resistive region 15b located between the control region 15a and the drain electrode 19 is etched to have a thickness of about 100 nm.

Figure 6:
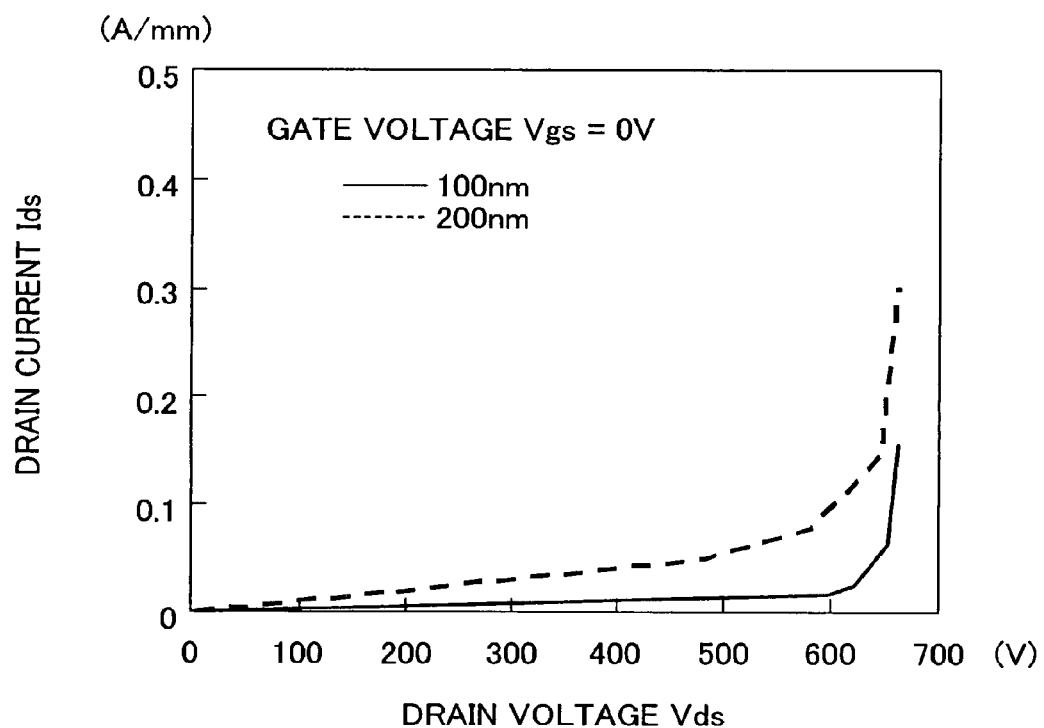
FIG. 6 is a graph showing the drain current and the drain voltage characteristics of the nitride semiconductor transistor according to the second embodiment of the present invention.

FIG. 6 shows the off-state breakdown voltage characteristics of the transistor according to the second embodiment. In FIG. 6, the gate voltage is set at 0 V. As shown in FIG. 6, as the high resistive region 15b is thinner, the drain leakage current occurring in increasing the drain voltage is reduced. From this, it is found that the breakdown voltage property of the transistor is improved.

In the second embodiment, the high resistive region is thinned also between the control region and the source electrode. However, in order to decrease the leakage current between the gate and the drain to improve the breakdown voltage, it is sufficient that at least the high resistive region between the control region and the drain electrode is thinned.

Third Embodiment

Figure 7:
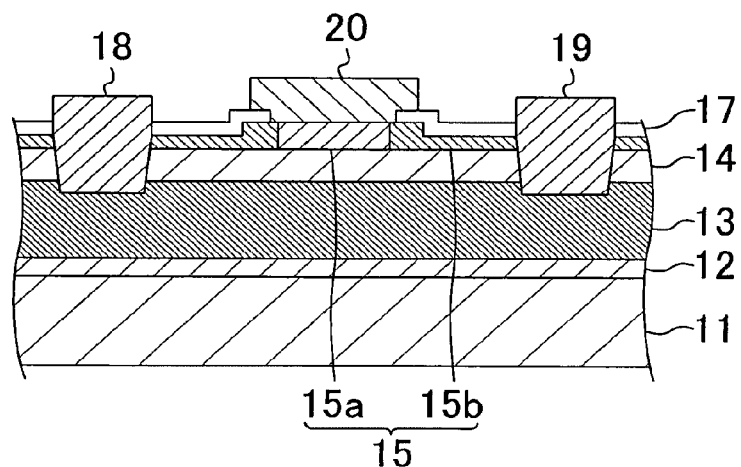
FIG. 7 is a cross sectional view showing a nitride semiconductor transistor according to a third embodiment of the present invention.

A third embodiment of the present invention will be described below with reference to the accompanying drawings. FIG. 7 shows a cross-sectional structure of a nitride semiconductor transistor according to the third embodiment. The description of the components shown in FIG. 7 that are the same as those shown in FIG. 5 will be omitted by retaining the same reference numerals.

Referring to FIG. 7, in the transistor according to the third embodiment, the top of the third nitride semiconductor layer 15 is formed with not a hydrogen diffusion barrier film but a hydrogen diffusion film 17 for supplying hydrogen. It is sufficient that the hydrogen diffusion film 17 is deposited by, for example, a plasma enhanced CVD method and made of silicon nitride (SiN) containing equal to or more than $1\times10^{20}/cm^{-3}$ of hydrogen. The SiN film containing hydrogen releases hydrogen by a thermal treatment. Therefore, to a portion of the third nitride semiconductor layer 15 covered with the hydrogen diffusion film 17, hydrogen from the hydrogen diffusion film 17 is supplied during a thermal treatment for selectively inactivating impurities. Thus, in the portion of the third nitride semiconductor layer 15 covered with the hydrogen diffusion film 17, less or no hydrogen desorbs from the contained impurities, whereby the impurities are kept in inactivated state. On the other hand, in the portion thereof exposed from the opening of the third nitride semiconductor layer 15, the impurities contained are activated, whereby the control region 15a having p-type conductivity can be selectively formed.

Figure 8:
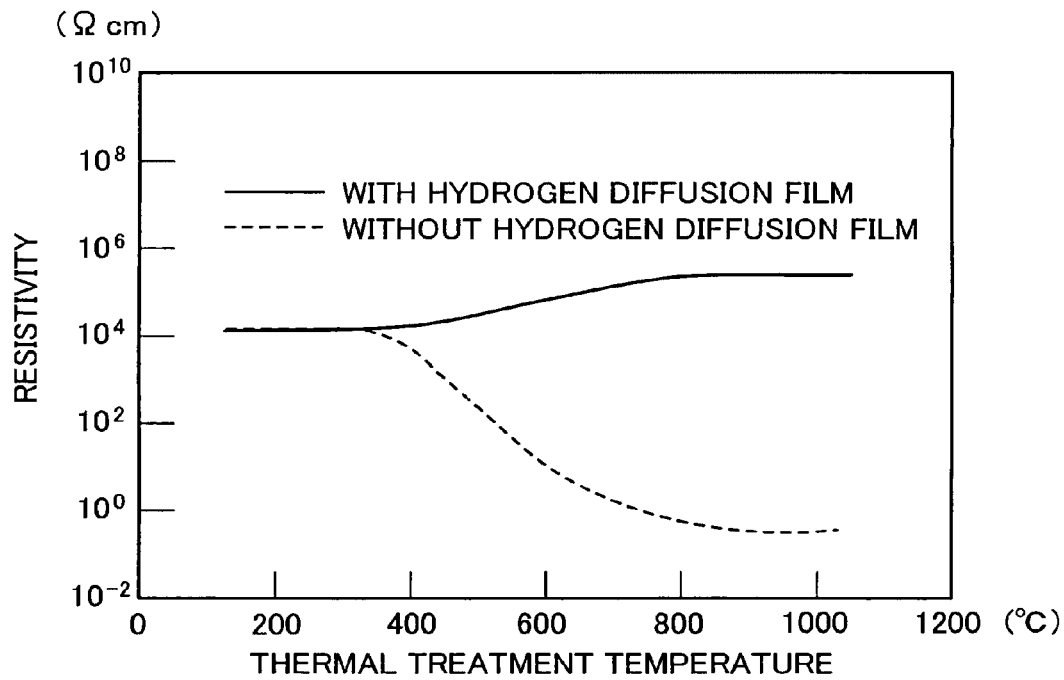
FIG. 8 is a graph showing the correlation between the temperature of a thermal treatment and the resistivity of a nitride semiconductor layer containing a p-type impurity in the nitride semiconductor transistor according to the third embodiment of the present invention.

FIG. 8 shows the correlation between the temperature of the thermal treatment and the resistivity in the case where an $Al_{0.15}Ga_{0.85}N$ layer doped with Mg to have a concentration of about $1\times10^{19}$ cm$^{-3}$ is subjected to a thermal treatment. The thermal treatment was performed in a nitrogen atmosphere for 20 minutes. As shown in FIG. 8, in the case of forming the hydrogen diffusion film of SiN containing hydrogen, the resistivity of the $Al_{0.15}Ga_{0.85}N$ layer slightly increases with an increasing temperature of the thermal treatment. This is probably because hydrogen is supplied from the hydrogen diffusion film and then the supplied hydrogen combined with Mg in the $Al_{0.15}Ga_{0.85}N$ layer.

Figure 9:
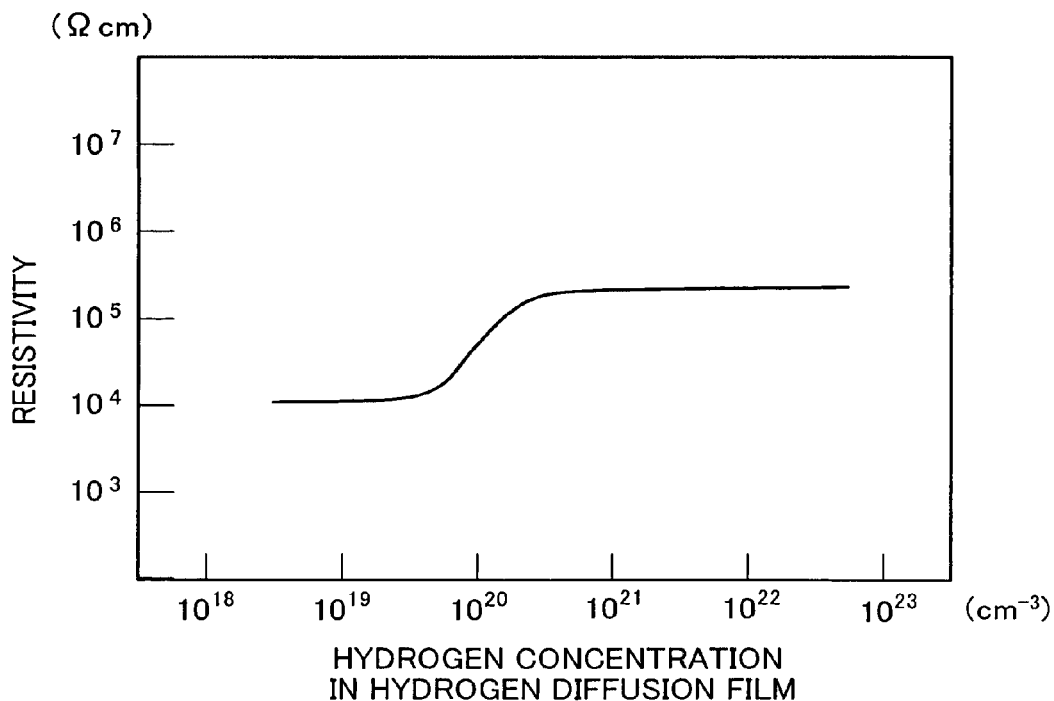
FIG. 9 is a graph showing the correlation between the hydrogen concentration in a hydrogen diffusion film and the resistivity of the nitride semiconductor layer containing a p-type impurity in the nitride semiconductor transistor according to the third embodiment of the present invention.

FIG. 9 shows the correlation between the hydrogen concentration in the hydrogen diffusion film and the resistivity of the $Al_{0.15}Ga_{0.85}N$ layer when the $Al_{0.15}Ga_{0.85}N$ layer doped with Mg is covered with the hydrogen diffusion film and then subjected to a thermal treatment. In FIG. 9, the temperature of the thermal treatment is set at 800° C. and the thermal treatment time is set at 20 minutes. As shown in FIG. 9, by setting the hydrogen concentration in the hydrogen diffusion film at $1\times10^{20}$ cm$^{-3}$ or higher, Mg inactivation can be promoted to raise the resistivity. The SiN film containing an appropriate concentration of hydrogen can be formed easily by setting an appropriate film-formation condition for forming the SiN film by a plasma enhanced CVD method.

The case where part of the high resistive region 15b is thinned like the second embodiment has been exemplarily shown in this embodiment, but the thickness of the high resistive region 15b may be constant like the first embodiment. In the case where a thermal treatment step of exposing the transistor to a temperature of 400° C. or higher is not carried out after formation of the control region 15a, the hydrogen diffusion film 17 may be removed after formation of the control region 15a.

Fourth Embodiment

Figure 10:
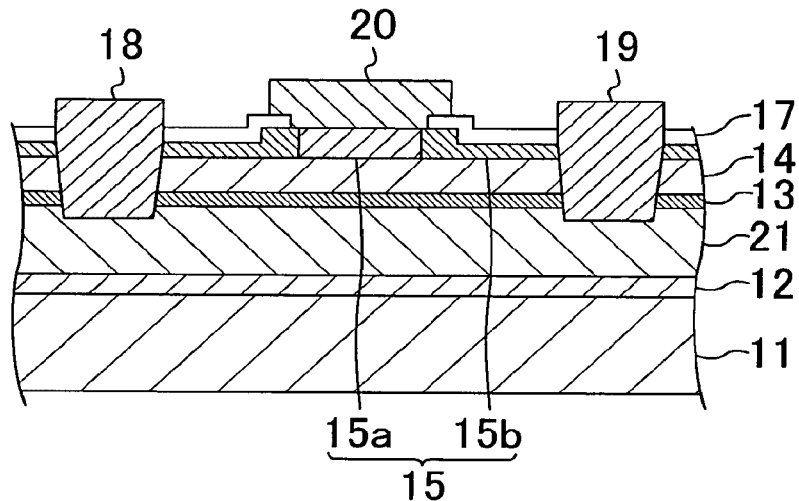
FIG. 10 is a cross sectional view showing a nitride semiconductor transistor according to a fourth embodiment of the present invention.

A fourth embodiment of the present invention will be described below with reference to the accompanying drawings. FIG. 10 shows a cross-sectional structure of a nitride semiconductor transistor according to the fourth embodiment. The description of the components shown in FIG. 10 that are the same as those shown in FIG. 7 will be omitted by retaining the same reference numerals.

Referring to FIG. 10, in the transistor according to the fourth embodiment, the first nitride semiconductor layer 13 of GaN is set to have a thickness of 10 nm, and a fourth nitride semiconductor layer 21 of undoped $Al_{0.08}Ga_{0.92}N$ having a thickness of 1 μm is provided under the first nitride semiconductor layer.

Figure 11:
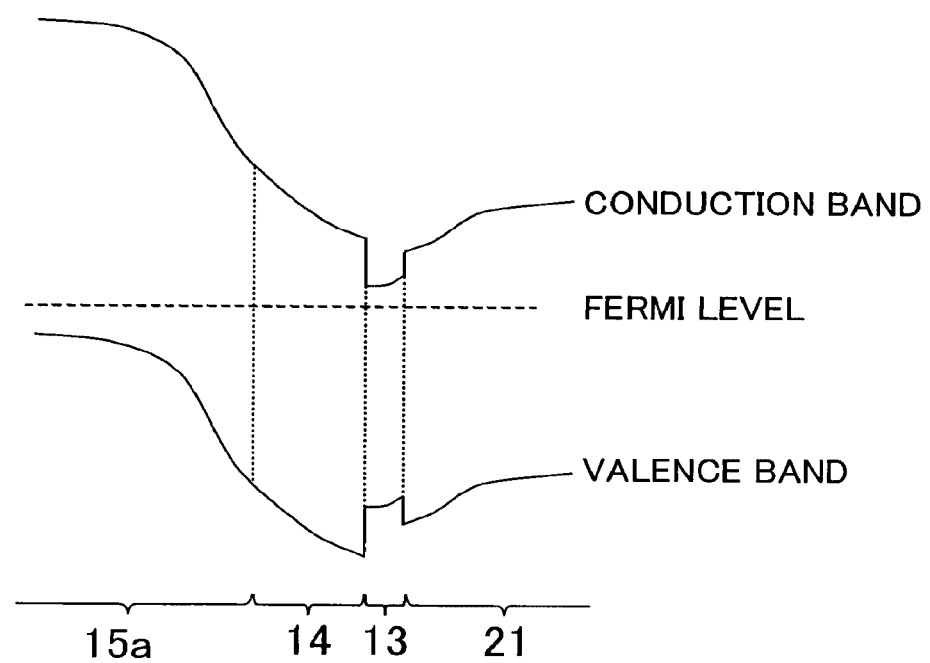
FIG. 11 is a band diagram showing an energy band structure of the nitride semiconductor transistor according to the fourth embodiment of the present invention.

FIG. 11 shows an energy band of the control region of the transistor according to the fourth embodiment. As shown in FIG. 11, the first nitride semiconductor layer 13 is interposed between the fourth nitride semiconductor layer 21 and the second nitride semiconductor layer 14 both of which are made of AlGaN and have wide band gaps. Therefore, the band gap has a concave occurring at the first nitride semiconductor layer 13, and a potential well is created in the conduction band and the valence band.

In the transistor of the fourth embodiment, at the interface between the first nitride semiconductor layer 13 and the fourth nitride semiconductor layer 21, the potential well is created in the valence band. Thus, holes injected from the control region 15a into the channel region are confined by the potential well. This further efficiently increases a current flowing in the channel region by the holes injected into the channel region.

Figure 12:
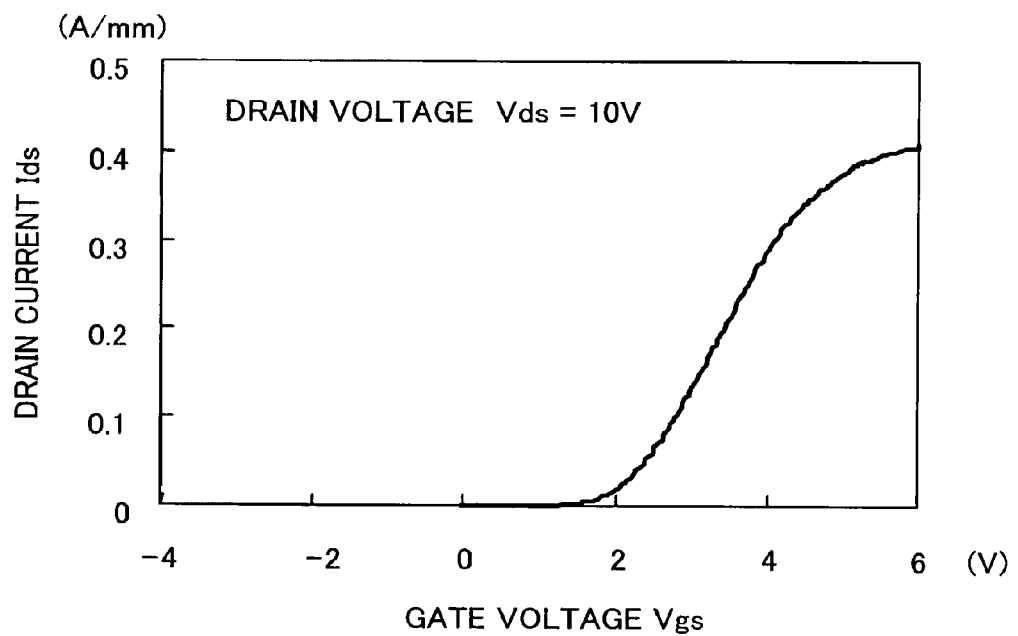
FIG. 12 is a graph showing the drain current and the gate voltage characteristics in the nitride semiconductor transistor according to the fourth embodiment of the present invention.

FIG. 12 shows the drain current and the gate voltage characteristics. As shown in FIG. 12, by providing the fourth nitride semiconductor layer 21, the threshold voltage becomes about 2 V. Therefore, even though a positive bias of 5 V or higher is applied to the gate electrode, a significant gate leakage current reduces and a maximum drain current of about 400 mA/mm is obtained.

In the fourth embodiment, the Al contents of the second nitride semiconductor layer and the fourth nitride semiconductor layer are not particularly limited. However, from the viewpoint of increasing the carrier concentration in the channel region, it is preferable that the Al content of the second nitride semiconductor layer be made higher than the Al content of the fourth nitride semiconductor layer. In addition, the electron concentration in the channel region becomes equal to the difference in the amount of spontaneous polarization between the fourth nitride semiconductor layer 21 and the second nitride semiconductor layer 14. Therefore, if the fourth nitride semiconductor layer 21 is set to have the same Al content as the second nitride semiconductor layer, the average electron concentration in the channel region can be almost zero when no bias is applied to the control region. This makes it possible to increase a current in the channel region according to the amount of holes injected from the control region into the channel region.

Although the case of forming the hydrogen diffusion film has been exemplarily shown in FIG. 10, the case of forming a hydrogen barrier film can also exert the same effects.

Fifth Embodiment

Figure 13:
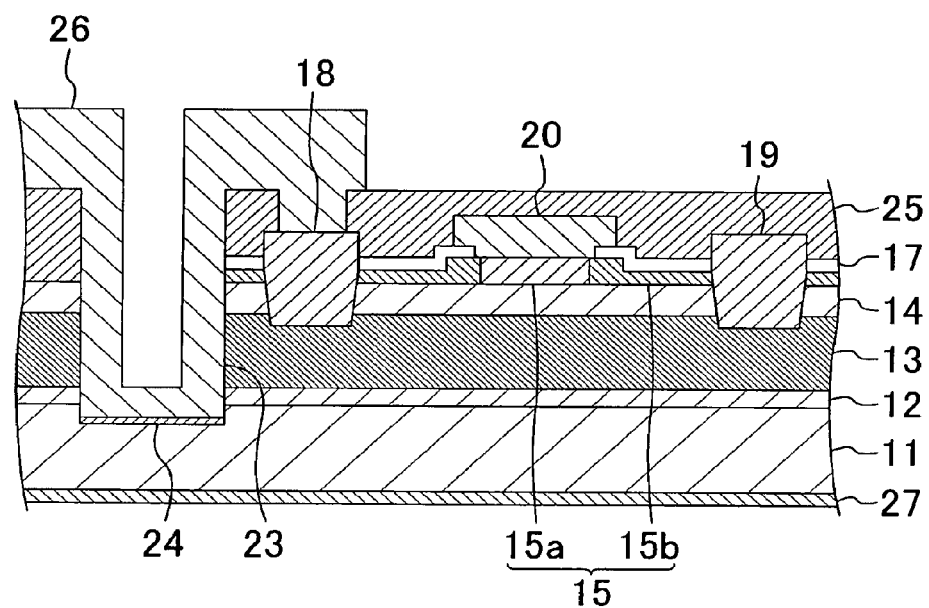
FIG. 13 is a cross sectional view showing a nitride semiconductor transistor according to a fifth embodiment of the present invention.

A fifth embodiment of the present invention will be described below with reference to the accompanying drawings. FIG. 13 shows a cross-sectional structure of a nitride semiconductor transistor according to the fifth embodiment. The description of the components shown in FIG. 13 that are the same as those shown in FIG. 7 will be omitted by retaining the same reference numerals.

Referring to FIG. 13, in the transistor of the fifth embodiment, the source electrode 18 is extended to the back surface of the substrate 11. A via hole is formed through the high resistive region 15b, the second nitride semiconductor layer 14, the first nitride semiconductor layer 13, and the buffer layer 12 and to etch part of the substrate 11 of silicon, and the via hole is filled with a conductive material to form a via plug 23. A via-hole metal film 24 of Al or the like is formed on a portion of the substrate 11 located at the bottom surface of the via hole, and the substrate 11 and the via plug 23 are in ohmic contact with each other.

The via plug 23 and the source electrode 18 are electrically connected by a metal interconnect 26 formed through a passivation film 25 of SiN covering the top surface of the transistor. The back surface of the substrate 11 is formed with a backside electrode 27 made of, for example, a stacked film of AuGeSb, Cr, NiCr, and Ni, and the source electrode 18 can be grounded from the back surface of the substrate 11.

Although the case where the source electrode of the transistor of the third embodiment is extended to the back surface of the substrate has been exemplarily shown in FIG. 13, the source electrode of the transistor of another embodiment can also be extended to the back surface of the substrate in the same manner.

In each of the embodiments, description has been made of the normally-off type transistor. Alternatively, the p-type impurity concentration in the control region, the thickness and the Al composition of the AlGaN layer serving as the second nitride semiconductor layer, and the like can be adjusted to form a normally-on type transistor. Also in the normally-on type transistor, holes are injected from the control region into the channel region, whereby not only an operating current can be increased but also a positive bias as high as 5 V or more can be applied to the gate electrode. This offers expectations for a significant effect such as facilitation of design of a gate drive circuit of the nitride semiconductor transistor.

As described above, with the nitride semiconductor transistor and its fabrication method according to the present invention, a nitride semiconductor transistor can be provided which has a large operating current and an excellent switching characteristic and which is easily designed to operate as a normally-off transistor. Accordingly, for example, the present invention is useful for a nitride semiconductor transistor such as a power transistor with a high breakdown voltage, and for its fabrication method.

What is claimed is:

1. A nitride semiconductor FET comprising:
    a first nitride semiconductor layer formed over a substrate;
    a second nitride semiconductor layer formed on the first nitride semiconductor layer and having a wider band gap than the first nitride semiconductor layer;
    a third nitride semiconductor layer which is formed on the second nitride semiconductor layer and which includes a control region doped with magnesium and high resistive region formed around the control region and containing hydrogen combined with magnesium;
    a gate electrode formed on the control region;
    a source electrode formed on a first side of the gate electrode; and
    a drain electrode formed on a second side of the gate electrode which is different from the first side of the gate electrode,
    wherein the control region and the high resistive region contain a group III element, and an amount of the group III element in the control region is substantially the same as amount of the group III element in the high resistive region, and
    the high resistive region is disposed between the gate electrode and the source electrode, and between the gate electrode and the drain electrode.

2. The nitride semiconductor FET of claim 1, further comprising:
    the high resistive region is thinner than the control region.

3. The nitride semiconductor FET of claim 1, wherein the control region has p-type conductivity.

* * * * *